(12) United States Patent
Yoshii

(10) Patent No.: US 10,702,954 B2
(45) Date of Patent: **\*Jul. 7, 2020**

(54) CONDUCTIVE PASTE

(71) Applicant: NAMICS CORPORATION, Niigata-shi, Niigata (JP)

(72) Inventor: Yoshiaki Yoshii, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/127,406

(22) PCT Filed: Mar. 20, 2015

(86) PCT No.: PCT/JP2015/058397
§ 371 (c)(1),
(2) Date: Sep. 19, 2016

(87) PCT Pub. No.: WO2015/141816
PCT Pub. Date: Sep. 24, 2015

(65) Prior Publication Data
US 2017/0129058 A1 May 11, 2017

(30) Foreign Application Priority Data

Mar. 20, 2014 (JP) ................................. 2014-057788

(51) Int. Cl.
| | | |
|---|---|---|
| *H01B 1/20* | (2006.01) |
| *H01B 1/22* | (2006.01) |
| *B23K 35/30* | (2006.01) |
| *H05K 1/09* | (2006.01) |
| *B22F 1/00* | (2006.01) |
| *C03C 8/18* | (2006.01) |
| *C03C 8/20* | (2006.01) |
| *B23K 35/36* | (2006.01) |
| *B22F 3/10* | (2006.01) |
| *B23K 1/00* | (2006.01) |
| *B23K 35/02* | (2006.01) |
| *C03C 3/14* | (2006.01) |
| *C03C 4/14* | (2006.01) |
| *C03C 8/02* | (2006.01) |
| *C09D 5/24* | (2006.01) |
| *H05K 1/18* | (2006.01) |
| *H05K 3/12* | (2006.01) |
| *H05K 3/34* | (2006.01) |

(52) U.S. Cl.
CPC ........ *B23K 35/3006* (2013.01); *B22F 1/0059* (2013.01); *B22F 3/10* (2013.01); *B23K 1/0016* (2013.01); *B23K 35/025* (2013.01); *B23K 35/3601* (2013.01); *B23K 35/3602* (2013.01); *B23K 35/3612* (2013.01); *C03C 3/14* (2013.01); *C03C 4/14* (2013.01); *C03C 8/02* (2013.01); *C03C 8/18* (2013.01); *C03C 8/20* (2013.01); *C09D 5/24* (2013.01); *H01B 1/22* (2013.01); *H05K 1/095* (2013.01); *H05K 1/181* (2013.01); *H05K 3/1291* (2013.01); *H05K 3/3484* (2013.01); *B22F 2301/10* (2013.01); *B22F 2301/255* (2013.01); *B22F 2301/30* (2013.01); *B22F 2302/25* (2013.01); *B22F 2302/45* (2013.01); *B22F 2304/10* (2013.01)

(58) Field of Classification Search
CPC ... H01B 1/20; H01B 1/22; C09D 5/24; C09D 7/12
See application file for complete search history.

(56) References Cited

U.S. PATENT DOCUMENTS

| | | | |
|---|---|---|---|
| 6,132,937 A | 10/2000 | Suzuki | |
| 7,780,878 B2 * | 8/2010 | Young | C03C 8/14 252/514 |
| 8,383,015 B2 * | 2/2013 | Ota | C22C 1/0425 252/512 |
| 2004/0155227 A1 | 8/2004 | Bechtloff et al. | |
| 2012/0260981 A1 * | 10/2012 | Adachi | H01B 1/16 136/256 |
| 2015/0299477 A1 | 10/2015 | Yoshii | |

FOREIGN PATENT DOCUMENTS

| | | |
|---|---|---|
| CN | 1500276 A | 5/2004 |
| JP | 55149356 | * 11/1980 |
| JP | 55149356 A | 11/1980 |
| JP | 0514363 B2 | 2/1993 |
| JP | 11258793 A | 9/1999 |
| JP | 2003115216 A | 4/2003 |
| JP | 2006196421 A | 7/2006 |
| JP | 2007123301 A | 5/2007 |
| JP | 2014187255 A | 10/2014 |
| WO | 2014061765 A1 | 4/2014 |

OTHER PUBLICATIONS

Machine translation of JP55149356.*
International Search Report (ISR) and Written Opinion dated Jun. 2, 2015 issued in International Application No. PCT/JP2015/058397.
Chinese Office Action (and English translation thereof) dated Apr. 24, 2017 issued in counterpart Chinese Application No. 201580012778.7.

* cited by examiner

Primary Examiner — Haidung D Nguyen
(74) Attorney, Agent, or Firm — Holtz, Holtz & Volek PC

(57) ABSTRACT

A conductive paste including (A) a silver powder, (B) a glass frit, (C) an organic binder and (D) a powder containing Cu and at least one metal element selected from the group consisting of V, Cr, Mn, Fe and Co. The powder (D) may thus contain Cu and Mn, Cu and Fe or Cu and Co. The conductive paste has a desirable electromigration resistance, solder heat resistance and adhesiveness to a substrate.

20 Claims, 3 Drawing Sheets

CONDUCTIVE PASTE

TECHNICAL FIELD

The present invention relates to, for example, a conductive paste which can be used for formation of an external electrode of a laminated ceramic part or a conductor pattern of a printed wiring board.

BACKGROUND ART

The conductive paste is a material in which metal particles are dispersed in a vehicle comprising an organic binder and a solvent, and it has been used for formation of a conductor pattern of a printed wiring board or formation of an external electrode of a laminated ceramic electronic part, etc. In the conductive paste, there are a resin curing type in which conductivity is ensured by contacting the metal particles due to curing of the resin, and a sintering type in which conductivity is ensured by sintering of the metal particles to each other by sintering.

As the metal particles to be contained in the conductive paste, for example, copper powder or silver powder has been used. The copper powder has the merits that it is excellent in conductivity and inexpensive than that of the silver powder. However, the copper powder is likely oxidized in the atmosphere so that there is a defect that, for example, the surface of a conductor pattern must be covered by a protecting material after forming the conductor pattern onto a substrate. On the other hand, the silver powder has merits that it is stable in the atmosphere, and a conductor pattern can be formed by sintering in the atmosphere. However, the silver powder has a defect that it easily causes electromigration.

As a technique to prevent from electromigration, in Patent Document 1, there is disclosed a conductive paint which comprises silver powder as a main conductive material and contains 1 to 100 parts by mass of powder of manganese and/or manganese alloy based on 100 parts by mass of the silver powder. In Patent Document 2, there is disclosed a conductive paste containing a binder resin, Ag powder and at least one metal or metallic compound selected from the group consisting of Ti, Ni, In, Sn and Sb.

However, the conductive pastes disclosed in Patent Documents 1 and 2 are insufficient in adhesiveness to the substrate or solder heat resistance, so that there is a practical problem for using these for formation of a conductor pattern onto the substrate.

Thus, as a technique to improve solder heat resistance of the conductive paste, in Patent Document 3, there is disclosed a conductive paste in which silver powder is coated by a material containing a first metal component which suppress sintering of the silver and a second metal component which promotes sintering of the silver.

However, in the conductive paste disclosed in Patent Document 3, solder heat resistance can be improved with a certain extent, but there is a problem that sintering of the silver is suppressed so that conductivity of the conductor pattern obtained by sintering the conductive paste is lowered. In addition, a step of coating a metal material onto the surface of the silver powder is required so that there is a problem that the manufacturing process becomes complex.

PRIOR ART DOCUMENTS

Patent Documents

Patent Document 1: JP Sho. 55-149356A
Patent Document 2: JP 2003-115216A
Patent Document 3: JP 2006-196421A

SUMMARY OF THE INVENTION

Problems to be Solved by the Invention

An object of the present invention is to provide a conductive paste excellent in electromigration resistance, solder heat resistance and adhesiveness to the substrate.

Means to Solve the Problems

The present inventors have earnestly studied on a sintering type conductive paste which can sufficiently satisfy electromigration resistance, solder heat resistance and adhesiveness to the substrate. As a result, the present inventors have found that it is effective to contain a Cu element in addition to silver powder, glass flit and an organic binder, and add powder containing at least one metal element selected from the group consisting of V, Cr, Mn, Fe and Co, whereby they have accomplished the present invention.

The present invention is as follows.

(1) A conductive paste which comprises the following Components (A) to (D):
(A) silver powder
(B) glass frit
(C) an organic binder and
(D) powder containing a Cu element and at least one metal element selected from the group consisting of V, Cr, Mn, Fe and Co.

(2) The conductive paste described in the above-mentioned (1), wherein the powder (D) contains Cu and Mn.

(3) The conductive paste described in the above-mentioned (1), wherein the powder (D) contains Cu and Fe.

(4) The conductive paste described in the above-mentioned (1), wherein the powder (D) contains Cu and Co.

(5) The conductive paste described in the above-mentioned any one of (1) to (4), wherein the powder (D) further contains a metal element(s) other than Cu, V, Cr, Mn, Fe and Co.

(6) The conductive paste described in the above-mentioned (5), wherein the powder (D) contains at least one metal element selected from the group consisting of Ti, Ni, Zn, In, Sn, Te, Pb, Bi, Pd, Pt and Au.

(7) The conductive paste described in the above-mentioned (6), wherein the powder (D) contains Sn or Bi.

(8) The conductive paste described in the above-mentioned any one of (1) to (7), wherein the powder (D) is mixed powder containing a plural kinds of metal elements.

(9) The conductive paste described in the above-mentioned any one of (1) to (7), wherein the powder (D) is alloy powder containing a plural kinds of metal elements.

(10) The conductive paste described in the above-mentioned any one of (1) to (7), wherein the powder (D) is compound powder containing a plural kinds of metal elements.

(11) The conductive paste described in the above-mentioned any one of (1) to (10), wherein the powder (D) contains an oxide or a hydroxide of a metal element(s).

(12) The conductive paste described in the above-mentioned any one of (1) to (11), wherein the powder (D) is contained in an amount of 0.1 to 5.0 parts by mass based on 100 parts by mass of the silver powder (A).

(13) The conductive paste described in the above-mentioned any one of (1) to (12), wherein an average particle diameter of the silver powder (A) is 0.1 to 100 µm.

(14) The conductive paste described in the above-mentioned any one of (1) to (13), wherein a viscosity thereof is 50 to 700 Pa·s.

(15) A laminated ceramic electronic part comprising an external electrode obtained by sintering the conductive paste described in the above-mentioned any one of (1) to (14) at 500 to 900° C.

(16) A printed wiring board obtained by coating the conductive paste described in the above-mentioned any one of (1) to (14) onto a substrate and sintering the conductive paste at 500 to 900° C.

(17) An electronic device obtained by soldering an electronic part onto the printed wiring board described in the above-mentioned (16).

Effects of the Invention

According to the present invention, a conductive paste excellent in electromigration resistance, solder heat resistance and adhesiveness to the substrate can be provided.

EMBODIMENTS TO CARRY OUT THE INVENTION

Figure 1:
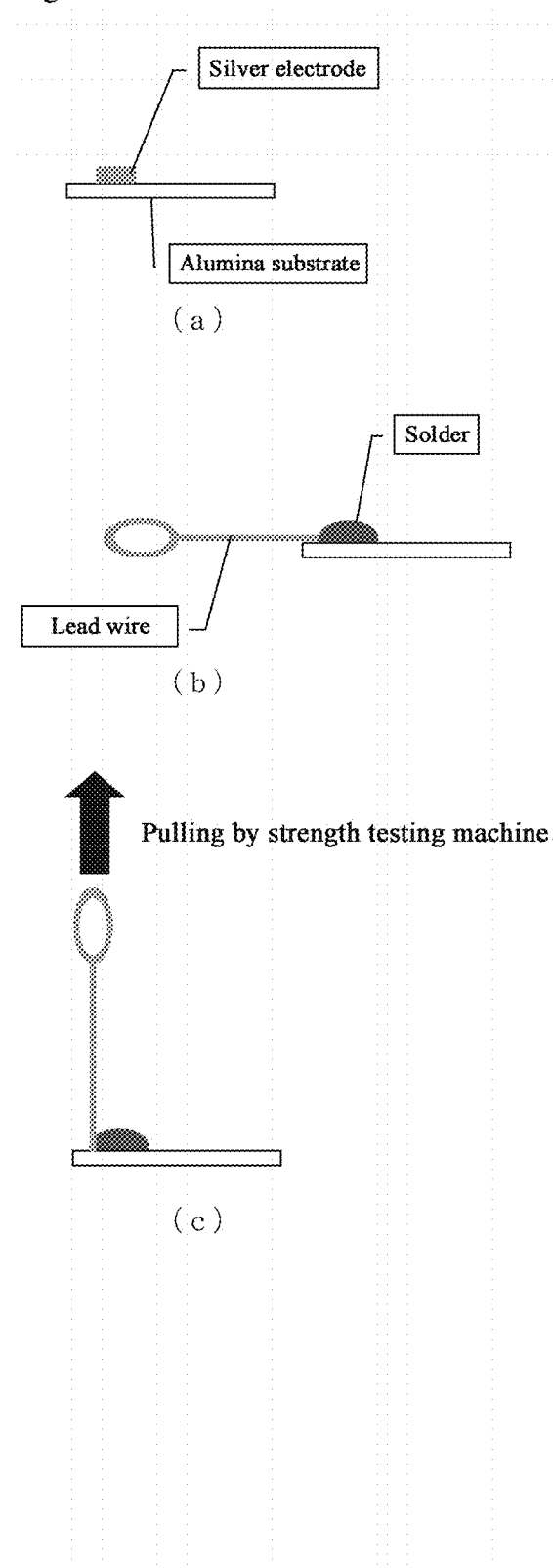
FIG. 1 is a drawing showing a method of adhesion strength test.

In the following, an embodiment to carry out the present invention is described in detail.

The conductive paste according to the embodiment of the present invention comprises (A) silver powder, (B) glass frit, (C) an organic binder and (D) a Cu element, and, powder containing at least one kind of a metal element selected from V, Cr, Mn, Fe and Co.

(A) Silver Powder

The conductive paste of the present invention contains silver powder (A) as conductive particles. The silver powder which can be used in the present invention may be a powder comprising silver or an alloy containing silver. A shape of the silver powder particles is not particularly limited and, for example, it is possible to use silver powder particles having spherical, granular, flake or scaly shape.

An average particle diameter of the silver powder to be used in the present invention is preferably 0.1 μm to 100 μm, more preferably 0.1 μm to 20 μm, and most preferably 0.1 μm to 10 μm. The average particle diameter herein mentioned means a median diameter on a volume basis (d50) obtained by a laser diffraction scattering type particle size distribution measurement method.

For developing high conductivity to the conductive paste, it is preferred to make the particle diameter of the silver powder contained in the conductive paste larger. However, if the particle diameter of the silver powder is too large, coating property or workability of the conductive paste to the substrate is impaired. Or else, when an external electrode of a laminated ceramics electronic part is formed by using the conductive paste, adhesiveness of the conductive paste to the ceramic element body is impaired. Accordingly, as long as the coating property or adhesiveness of the conductive paste to the substrate or the coating property or adhesiveness of the ceramic element body is not impaired, it is preferred to use the silver powder having larger particle diameter. When these matter are taking into consideration, an average particle diameter of the silver powder used in the present invention is preferably within the above-mentioned range.

The preparation process of the silver powder is not particularly limited and it can be produced by, for example, the reducing method, the pulverizing method, the electrolytic method, the atomization method, the heat treatment method, or a combination thereof. The flaky silver powder can be produced by, for example, crushing spherical or granular silver particles with a ball mill, etc.

(B) Glass Frit

The conductive paste of the present invention contains the glass frit (B). Accordingly, adhesiveness to the substrate of the conductor pattern obtained by sintering the conductive paste is improved. Also, adhesiveness of the external electrode obtained by sintering the conductive paste to the ceramic element body is improved.

The glass frit to be used in the present invention is not particularly limited, and may be a glass frit preferably having a softening point of 300° C. or higher, more preferably a softening point of 400 to 1,000° C., further preferably a softening point of 400 to 700° C. The softening point of the glass flit can be measured by using a thermogravimetric apparatus (for example, manufactured by BRUKER AXS GmbH, TG-DTA2000SA).

The glass frit may be specifically mentioned, for example, glass frit such as bismuth borosilicate-based, alkali metal borosilicate-based, alkaline earth metal borosilicate-based, zinc borosilicate-based, lead borosilicate-based, lead borate-based, lead silicate-based, bismuth borate-based, zinc borate-based, etc. The glass frit is preferably lead-free in the point of consideration to the environment and an example thereof is bismuth borosilicate-based glass frit, alkali metal borosilicate-based glass frit, etc.

The average particle diameter of the glass frit is preferably 0.1 to 20 μm, more preferably 0.2 to 10 μm, most preferably 0.5 to 5 μm. The average particle diameter herein mentioned means a median diameter on a volume basis (d50) obtained by a laser diffraction scattering type particle size distribution measurement method.

In the conductive paste of the present invention, a content of (B) the glass fit is preferably 0.01 to 20 parts by mass, more preferably 0.1 to 10 parts by mass based on 100 parts by mass of the silver powder (A). If the content of the glass frit is less than the range, adhesiveness to the substrate of the conductor pattern obtained by sintering the conductive paste is lowered. Or else, adhesiveness of the external electrode obtained by sintering the conductive paste to the ceramic element body is lowered. On the other hand, if the content of the glass frit is larger than the range, conductivity of a conductor pattern or an external electrode obtained by sintering the conductive paste is lowered.

(C) Organic Binder

The conductive paste of the present invention contains an organic binder (C). The organic binder in the present invention is not particularly limited, and may be a material which is to combine the silver powders to each other in the conductive paste, and burnt off at the time of sintering the conductive paste. The organic binder may be, for example, a thermosetting resin or a thermoplastic resin.

The thermosetting resin may be, for example, an epoxy resin, a urethane resin, a vinyl ester resin, a silicone resin, a phenol resin, a urea resin, a melamine resin, an unsaturated polyester resin, a diallyl phthalate resin, a polyimide resin, etc.

The thermoplastic resin may be, for example, a cellulose type resin such as ethyl cellulose, nitrocellulose, etc., an acrylic resin, an alkyd resin, a saturated polyester resin, a butyral resin, polyvinyl alcohol, hydroxypropyl cellulose, etc.

These resins may be used alone, or may be used in combination of two or more kinds.

In the conductive paste of the present invention, a content of the organic binder (C) is preferably 0.5 to 30 parts by mass, more preferably 1.0 to 10 parts by mass based on 100 parts by mass of the silver powder (A).

When the content of the organic binder (C) in the conductive paste is within the above-mentioned range, coating property of the conductive paste to the substrate is improved, whereby a fine pattern can be formed with high precision. Or else, coating property of the conductive paste to the ceramic element body is improved, whereby an external electrode can be formed with high precision. On the other hand, if the content of the organic binder (C) exceeds the above-mentioned range, an amount of the organic binder contained in the conductive paste is too much, whereby denseness of a conductor pattern or an external electrode obtained after sintering may be lowered.

(D) Powder containing a Cu element, and containing at least one metal element selected from the group consisting of V, Cr, Mn, Fe and Co The conductive paste of the present invention contains powder which contains a Cu element, and contains at least one metal element selected from the group consisting of V, Cr, Mn, Fe and Co. In the following, this powder is called as "powder (D)" in some cases. Examples of the powder (D) are as follows.

Examples of the Powder (D)
Powder containing Cu and V
Powder containing Cu and Cr
Powder containing Cu and Mn
Powder containing Cu and Fe
Powder containing Cu and Co
Powder containing Cu, Mn and V
Powder containing Cu, Mn and Cr
Powder containing Cu, Mn and Fe
Powder containing Cu, Mn and Co
Powder containing Cu, Fe and V
Powder containing Cu, Fe and Cr
Powder containing Cu, Fe and Mn
Powder containing Cu, Fe and Co
Powder containing Cu, Co and V
Powder containing Cu, Co and Cr
Powder containing Cu, Co and Mn
Powder containing Cu, Co and Fe The powder (D) may be a mixed powder in which a plural kind of powders containing the above-mentioned metal element(s) are mixed. The powder (D) may be an alloy powder comprising the alloy containing the above-mentioned metal elements. The powder (D) may be a compound powder comprising the compound containing the above-mentioned metal elements.

A plural kind of the metal elements contained in the powder (D) may be a simple substance or an oxide. For example, copper may be a simple metal (Cu) or may be an oxide (for example, CuO). Manganese may be a simple metal (Mn) or may be an oxide (for example, MnO). Cobalt may be a simple metal (Co) or may be an oxide (for example, CoO).

A plural kind of the metal elements contained in the powder (D) may be a compound (for example, a hydroxide) which is changed to an oxide at the time of sintering the conductive paste. For example, copper may be $Cu(OH)_2$. Manganese may be $Mn(OH)_2$. Cobalt may be $Co(OH)_2$.

The simple metal of manganese has extremely high hardness, so that it is difficult to obtain metal powder having a uniform particle diameter. Accordingly, manganese is preferably in the form of an oxide (for example, MnO) or an alloy.

When the powder (D) is contained in the conductive paste, electromigration resistance, solder heat resistance, adhesiveness to the substrate and adhesiveness to the ceramic element body of the conductive paste are improved. Such an epoch-making effect is firstly discovered by the present inventors. It is not clear the reason why such an effect can be obtained, but the fact that such an effect can be obtained has been confirmed experimentally by the present inventors.

In the conductive paste of the present invention, a content of the powder (D) is preferably 0.1 to 5.0 parts by mass, more preferably 0.2 to 3.0 parts by mass, further preferably 0.3 to 1.0 part by mass based on 100 parts by mass of the silver powder (A).

When the content of the powder (D) in the conductive paste is within the above-mentioned range, electromigration resistance, solder heat resistance, adhesiveness to the substrate and adhesiveness to the ceramic element body of the conductive paste are markedly improved.

It is particularly preferred that the powder (D) contains copper (Cu) and manganese (Mn).

In the conductive paste of the present invention, a content of copper (Cu) in terms of the element is preferably 0.005 to 2.85 parts by mass, more preferably 0.015 to 2 parts by mass based on 100 parts by mass of the silver powder (A).

In the conductive paste of the present invention, a content of manganese (Mn) in terms of the element is preferably 0.0001 to 0.9 part by mass, more preferably 0.0003 to 0.7 part by mass based on 100 parts by mass of the silver powder (A).

In the conductive paste of the present invention, a content of manganese in terms of the element is preferably 0.01 to 2.5 in a mass ratio when the content of copper is made 1.

When the contents of copper and manganese are adjusted within the above-mentioned range, electromigration resistance, solder heat resistance, adhesiveness to the substrate and adhesiveness to the ceramic element body of the conductive paste are further improved.

The above-mentioned powder (D) preferably further contains a metal element(s) other than Cu, V, Cr, Mn, Fe and Co.

The above-mentioned powder (D) preferably contains at least one metal element selected from the group consisting of Ti, Ni, Zn, In, Sn, Te, Pb, Bi, Pd, Pt and Au.

It is particularly preferred that the above-mentioned powder (D) contains Sn or Bi.

Examples of such powder (D) are as follows.
Example of Powder (D)
Powder containing Cu, V and Ti
Powder containing Cu, V and Ni
Powder containing Cu, V and Zn
Powder containing Cu, V and In
Powder containing Cu, V and Sn
Powder containing Cu, V and Te
Powder containing Cu, V and Pb
Powder containing Cu, V and Bi
Powder containing Cu, V and Pd
Powder containing Cu, V and Pt
Powder containing Cu, V and Au
Powder containing Cu, Cr and Ti
Powder containing Cu, Cr and Ni Powder containing Cu, Cr and Zn
Powder containing Cu, Cr and In
Powder containing Cu, Cr and Sn
Powder containing Cu, Cr and Te
Powder containing Cu, Cr and Pb
Powder containing Cu, Cr and Bi
Powder containing Cu, Cr and Pd
Powder containing Cu, Cr and Pt
Powder containing Cu, Cr and Au
Powder containing Cu, Mn and Ti
Powder containing Cu, Mn and Ni
Powder containing Cu, Mn and Zn
Powder containing Cu, Mn and In
Powder containing Cu, Mn and Sn
Powder containing Cu, Mn and Te
Powder containing Cu, Mn and Pb
Powder containing Cu, Mn and Bi
Powder containing Cu, Mn and Pd
Powder containing Cu, Mn and Pt
Powder containing Cu, Mn and Au
Powder containing Cu, Fe and Ti
Powder containing Cu, Fe and Ni
Powder containing Cu, Fe and Zn
Powder containing Cu, Fe and In
Powder containing Cu, Fe and Sn
Powder containing Cu, Fe and Te
Powder containing Cu, Fe and Pb
Powder containing Cu, Fe and Bi
Powder containing Cu, Fe and Pd
Powder containing Cu, Fe and Pt
Powder containing Cu, Fe and Au
Powder containing Cu, Co and Ti
Powder containing Cu, Co and Ni
Powder containing Cu, Co and Zn
Powder containing Cu, Co and In
Powder containing Cu, Co and Sn
Powder containing Cu, Co and Te
Powder containing Cu, Co and Pb
Powder containing Cu, Co and Bi
Powder containing Cu, Co and Pd
Powder containing Cu, Co and Pt
Powder containing Cu, Co and Au The conductive paste of the present invention may contain a solvent for adjusting viscosity, etc.

The solvent may be, for example, an alcohol such as methanol, ethanol, isopropyl alcohol (IPA), etc., an organic acid such as ethylene acetate, etc., an aromatic hydrocarbon such as toluene, xylene, etc., an N-alkylpyrrolidone such as N-methyl-2-pyrrolidone (NMP), etc., an amide such as N,N-dimethylformamide (DMF), etc., a ketone such as methyl ethyl ketone (MEK), etc., a cyclic carbonate such as terpineol (TEL), butyl carbitol (BC), etc., and water, etc.

A content of the solvent is not particularly limited, and is preferably 1 to 100 parts by mass, more preferably 5 to 60 parts by mass based on 100 parts by mass of the silver powder (A).

A viscosity of the conductive paste of the present invention is preferably 50 to 700 Pa·s, more preferably 100 to 300 Pa·s. When the viscosity of the conductive paste is adjusted within the above range, coating property or handling property of the conductive paste becomes good, and it is possible to coat the conductive paste to the substrate or the ceramic element body with uniform thickness.

The conductive paste of the present invention may contain other additives, for example, such as a dispersant, a rheology modifier, a pigment, etc.

The conductive paste of the present invention may further contain an inorganic filler (for example, fumed silica, calcium carbonate, talc, etc.), a coupling agent (for example, a silane coupling agent such as γ-glycidoxypropyltrimethoxysilane, etc., a titanate coupling agent such as tetraoctylbis(ditridecylphosphite)titanate, etc.), a silane monomer (for example, tris(3-(trimethoxysilyl)propyl)isocyanurate), a plasticizer (for example, a copolymer such as carboxyl group-terminal polybutadiene-acrylonitrile, etc., silicone rubber, resin powder such as silicone rubber powder, silicone resin powder, acrylic resin powder, etc.), a flame retardant, an antioxidant, a defoaming agent, etc.

The conductive paste of the present invention may contain a metal oxide. The metal oxide may be, for example, copper oxide, bismuth oxide, manganese oxide, cobalt oxide, magnesium oxide, tantalum oxide, niobium oxide, tungsten oxide, etc. If the conductive paste contains cobalt oxide, solder heat resistance of the conductive paste is improved. If the conductive paste contains bismuth oxide, sintering of the silver powder is promoted as well as solder wetting property of the conductive paste is improved.

The conductive paste of the present invention can be produced by mixing the above-mentioned respective components by using, for example, a grinding machine, a pot mill, a three roll mill, a rotary mixer, a twin-shaft mixer, etc.

A method for forming a conductor pattern onto a substrate using the conductive paste of the present invention is explained.

First, the conductive paste of the present invention is coated onto the substrate. The coating method is optional, and coating may be carried out by using the conventionally known method, for example, dispense, jet dispense, stencil printing, screen printing, pin transfer, stamping, etc. As the material of the substrate, alumina, glass ceramic, silicon nitride, aluminum nitride, etc., can be used.

After coating the conductive paste onto the substrate, the substrate is charged in an electric furnace, etc. Then, the conductive paste coated onto the substrate is sintered at 500 to 1,000° C., more preferably 600 to 1,000° C., further preferably 700 to 900° C. According to this procedure, silver powders contained in the conductive paste are sintered with each other, and the components such as the organic binder, etc., contained in the conductive paste are burned out.

The conductor pattern thus obtained has extremely high conductivity. In addition, it is excellent in electromigration resistance, solder heat resistance and adhesiveness to the substrate.

A method for producing a laminated ceramics electronic part using the conductive paste of the present invention is explained.

First, a ceramic element body is prepared. The ceramic element body is a ceramic laminated body obtained by, for example, pressing the laminated dielectric sheets, then, sintering the dielectric sheets. Next, the conductive paste of the present invention is coated at the end face of the prepared ceramic element body. Next, the conductive paste coated at the end face is sintered at 500 to 1,000° C., more preferably 600 to 1,000° C., further preferably 700 to 900° C. According to this procedure, an external electrode is formed at the end face of the ceramic element body.

The external electrode of the laminated ceramics electronic part thus obtained has extremely high conductivity. In addition, the external electrode thus obtained is excellent in electromigration resistance and solder heat resistance. Further, the external electrode thus obtained is excellent in adhesiveness to the ceramic element body. A treatment for heightening solder wetting property, such as nickel plating, tin plating, etc., may be carried out at the surface of the external electrode, if necessary.

The laminated ceramics electronic part for which the conductive paste of the present invention can be used to form an external electrode thereof is, for example, MLCC using a dielectric ceramic such as barium titanate, strontium titanate, calcium zirconate, etc., a varistor using ZnO, etc., an inductor using ferrite or a dielectric ceramic, etc.

The conductive paste of the present invention can be used for formation of a circuit of electronic parts, formation of an electrode, or conjugation of the electronic parts to the substrate, etc. In addition, the conductive paste of the present invention can be used for formation of a conductor pattern (circuit pattern) to an alumina substrate for an LED reflector. By using the conductive paste of the present invention, printed wiring boards and electronic products excellent in electric characteristics can be produced. By soldering the electronic parts onto the printed wiring board produced by using the conductive paste of the present invention, electronic devices excellent in electric characteristics can be produced.

EXAMPLES

[Preparation of Conductive Paste]

The following Components (A) to (D) were mixed to prepare conductive pastes of Examples 1 to 10.

(A) Silver Powder

Spherical silver powder having an average particle diameter of 2 μm.

(B) Glass Slit $Bi_2O_3 \cdot B_2O_3$ series glass frit having an average particle diameter of 1.0 μm and a softening point of 440° C.

(C) Organic Binder

An organic binder obtained by dissolving an ethyl cellulose resin in butyl carbitol was used. A mixing ratio of the ethyl cellulose resin and butyl carbitol is 30:70 (a mass ratio).

(D) Powder containing a Cu element and at least one kind of metal element selected from the group consisting of V, Cr, Mn, Fe and Co (Example 1) Alloy Powder Comprising CuMnBi Alloy Composition ratio of the metal elements is Cu: 1.76, Mn: 0.2 and Bi: 0.04 based on 100 parts by mass of Ag (Example 2) Alloy Powder Comprising CuMnFe Alloy Composition ratio of the metal elements is Cu: 1.76, Mn: 0.2 and Fe: 0.04 based on 100 parts by mass of Ag (Example 3) Alloy Powder Comprising CuMnSn Alloy Composition ratio of the metal elements is Cu: 1.76, Mn: 0.2 and Sn: 0.04 based on 100 parts by mass of Ag (Example 4) Alloy Powder Comprising CuCoSn Alloy Composition ratio of the metal elements is Cu: 1.76, Co: 0.2 and Sn: 0.04 based on 100 parts by mass of Ag (Example 5) Mixed Powder Containing CuO, $MnO_2$ and $SnO_2$ Mixing ratio of the metal elements is CuO: 1.76, $MnO_2$: 0.2 and $SnO_2$: 0.04 based on 100 parts by mass of Ag (Example 6) Mixed Powder Containing CuO, CoO and $SnO_2$ Mixing ratio of the metal elements is CuO: 1.76, CoO: 0.2 and $SnO_2$: 0.04 based on 100 parts by mass of Ag (Example 7) Mixed Powder Containing CuO, $MnO_2$ and $Bi_2O_3$ Mixing ratio of the metal elements is CuO: 1.76, $MnO_2$: 0.2 and $Bi_2O_3$: 0.04 based on 100 parts by mass of Ag (Example 8) Mixed Powder Containing CuO, $MnO_2$ and $TiO_2$ Mixing ratio of the metal elements is CuO: 1.76, $MnO_2$: 0.2 and $TiO_2$: 0.04 based on 100 parts by mass of Ag (Example 9) Mixed Powder Containing CuO, $MnO_2$ and $V_2O_5$ Mixing ratio of the metal elements is CuO: 1.76, $MnO_2$: 0.2 and $V_2O_5$: 0.04 based on 100 parts by mass of Ag (Example 10) Mixed Powder Containing CuO, $MnO_2$ and $Fe_3O_4$ Mixing ratio of the metal elements is CuO: 1.76, $MnO_2$: 0.2 and $Fe_3O_4$: 0.04 based on 100 parts by mass of Ag

[Preparation of Test Piece]

A conductive paste was coated onto the alumina substrate having 2 cm×2 cm×1 mm (t) by screen printing. According to this procedure, a pattern comprising a square pad shape with 1.5 mm on each side was formed. The mask used was made of stainless with 250 mesh. A thickness of the resist was 20 μm. Next, the conductive paste was dried by using a hot air dryer at 150° C. for 10 minutes. After the conductive paste was dried, the conductive paste was sintered by using a sintering furnace. The sintering temperature was 850° C. (Maximum temperature), and the sintering time was 60 minutes. A retention time at the maximum temperature was 10 minutes. According to this procedure, a test piece to be used for the following "solder wetting property test" and "solder heat resistance test" was prepared.

[Solder Wetting Property Test]

The test piece prepared as mentioned above was dipped in a lead-free soldering tank at 230° C. for 3 seconds, and then, the test piece was pulled up. Then, the surface of the square pad pattern was photographed by a camera, and a ratio (%) of an area at which "the solder" had been attached onto the surface of the square pad pattern was measured by subjecting the photographed image to the digital treatment. The results of the solder wetting property test are shown in the following Table 1.

TABLE 1

| | Solder wetting property test | | | | | | | | | |
|---|---|---|---|---|---|---|---|---|---|---|
| | Example | | | | | | | | | |
| | 1 | 2 | 3 | 4 | 5 | 6 | 7 | 8 | 9 | 10 |
| Kind of powder (D) | CuMnBi | CuMnFe | CuMnSn | CuCoSn | CuO, MnO$_2$, SnO$_2$ | CuO, CoO, SnO$_2$ | CuO, MnO$_2$, Bi$_2$O$_3$ | CuO, MnO$_2$, TiO$_2$ | CuO, MnO$_2$, V$_2$O$_5$ | CuO, MnO$_2$, Fe$_3$O$_4$ |
| Solder wetting area | 99.3% | 97.8% | 98.8% | 98.5% | 98.1% | 98.3% | 98.6% | 100.0% | 98.5% | 98.3% |

[Solder Heat Resistance Test]

The test piece prepared as mentioned above was dipped in a lead-free soldering tank for 30 seconds, and then, the test piece was pulled up. Then, the square pad pattern remained onto the alumina substrate was photographed by a camera, and a ratio (%) of an area of the remained square pad pattern was measured by subjecting the photographed image to the digital treatment. A temperature of the lead-free soldering tank was changed to 260° C., 270° C. and 280° C. A dipping time was changed to 10 seconds, 20 seconds, 30 seconds and 40 seconds. The results of the solder heat resistance test are shown in the following Table 2.

(Maximum temperature), and the sintering time is 60 minutes. A retention time at the maximum temperature is 10 minutes.

(3) A lead wire (tin plating copper wire 0.6 mmφ) was conjugated to the sintered pattern as mentioned in the above (2) using a soldering iron (FIG. 1(b)). For the conjugation, a Pb-free solver was used. The composition of the used solver was Sn3.0Ag0.5Cu.

(4) In the above-mentioned (3), the lead wire conjugated to the pattern was pulled by a strength testing device to the direction perpendicular to the substrate, and a tensile strength (N) at the time that the conjugated portion was

TABLE 2

| | | Solder heat resistance test | | | | | | | | | |
|---|---|---|---|---|---|---|---|---|---|---|---|
| | | Example | | | | | | | | | |
| | | 1 | 2 | 3 | 4 | 5 | 6 | 7 | 8 | 9 | 10 |
| Kind of powder (D) | | CuMnBi | CuMnFe | CuMnSn | CuCoSn | CuO, MnO$_2$, SnO$_2$ | CuO, CoO, SnO$_2$ | CuO, MnO$_2$, Bi$_2$O$_3$ | CuO, MnO$_2$, TiO$_2$ | CuO, MnO$_2$, V$_2$O$_5$ | CuO, MnO$_2$, Fe$_3$O$_4$ |
| Dipping conditions | 260° C., 10 s | 90.6% | 88.7% | 91.6% | 91.8% | 90.9% | 90.2% | 89.3% | 88.6% | 90.5% | 90.0% |
| | 260° C., 20 s | 84.4% | 85.2% | 83.1% | 83.0% | 83.9% | 84.4% | 82.8% | 83.4% | 84.6% | 82.8% |
| | 260° C., 30 s | 74.3% | 75.7% | 75.9% | 74.8% | 78.5% | 76.5% | 81% | 86.7% | 84.8% | 76.6% |
| | 260° C., 40 s | 60.5% | 55.2% | 68.9% | 65.0% | 62.7% | 66.7% | 79.2% | 79.2% | 84.1% | 84.5% |
| | 270° C., 10 s | 88.2% | 87.4% | 89.6% | 89.2% | 88.9% | 88.2% | 87.5% | 87.5% | 87.7% | 87.7% |
| | 270° C., 20 s | 80.8% | 74.2% | 82.8% | 80.6% | 72.5% | 75.5% | 75.4% | 77.1% | 81.5% | 79.5% |
| | 270° C., 30 s | 62.4% | 47.4% | 66.1% | 62.1% | 79.7% | 68.0% | 80.8% | 70.6% | 69.9% | 81.4% |
| | 280° C., 10 s | 86.3% | 85.1% | 86.7% | 86.4% | 85.8% | 86.2% | 84.5% | 86.4% | 86.8% | 82.9% |
| | 280° C., 20 s | 77.7% | 75.5% | 79.9% | 76.5% | 85.9% | 77.2% | 72.8% | 77.0% | 74.4% | 68.5% |

[Adhesion Strength Test]

(1) A conductive paste was coated onto the alumina substrate having 2 cm×2 cm×1 mm (t) by screen printing. According to this procedure, a pattern comprising a square pad shape with 1.5 mm on each side was formed (FIG. 1(a)). The mask used was made of stainless with 250 mesh. A thickness of the resist was 20 μm.

(2) Next, the conductive paste was dried by using a hot air dryer at 150° C. for 5 minutes. After the conductive paste was dried, the conductive paste was sintered by using a sintering furnace. The sintering temperature is 850° C.

peeled off was measured (FIG. 1(c)). The measurement was carried out 10 times, and an average of the measured values at the 10 times was calculated.

(5) An alumina substrate was allowed to stand in a drier maintained at 150° C. for 100 hours, and then, the same test as mentioned in the above (4) was carried out.

(6) An alumina substrate was allowed to stand in a heat cycle testing machine for 100 cycles, and then, the same test as mentioned in the above (4) was carried out. One cycle is at −40 to 125° C., and at −40° C. for 30 minutes and at 125° C. for 30 minutes.

The results of the adhesion strength test were shown in the following Table 3.

TABLE 3

Adhesion strength test

| | Example | | | | | | | | | |
|---|---|---|---|---|---|---|---|---|---|---|
| | 1 | 2 | 3 | 4 | 5 | 6 | 7 | 8 | 9 | 10 |
| Kind of powder (D) | CuMnBi | CuMnFe | CuMnSn | CuCoSn | CuO, MnO$_2$, SnO$_2$ | CuO, CoO, SnO$_2$ | CuO, MnO$_2$, Bi$_2$O$_3$ | CuO, MnO$_2$, TiO$_2$ | CuO, MnO$_2$, V$_2$O$_5$ | CuO, MnO$_2$, Fe$_3$O$_4$ |
| Initial [N] | 27.2 | 23.2 | 26 | 23.7 | 20 | 23.8 | 28.9 | 23.9 | 22.9 | 25.5 |
| 100 hrs after heat cycle [N] | 15.0 | 19.2 | 15.7 | 18.2 | 17.4 | 17.4 | 18.2 | 19.2 | 16.5 | 18.3 |
| 100 hrs after lapsing at high temperature [N] | 25.5 | 21.8 | 24.5 | 22.1 | 18.6 | 23.3 | 25.5 | 25.4 | 20.4 | 24.3 |

[Electromigration Resistance Test]

Figure 2:
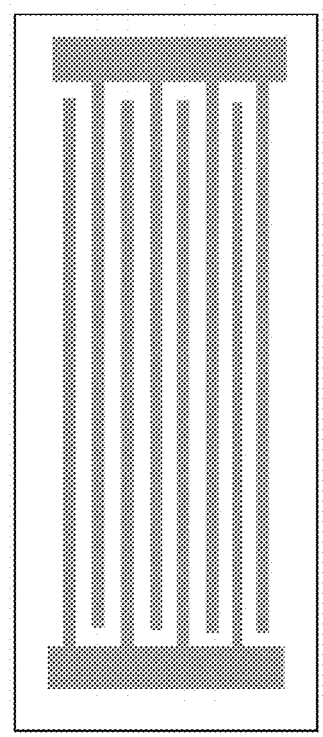
FIG. 2 is a drawing showing an electrode pattern formed for the electromigration resistance test.

By coating the conductive paste (conductive paste containing CuMnSn) of Example 3 onto an alumina substrate, an US pattern with a line width of 200 μm as shown in FIG. 2 was formed. Next, the formed pattern was heated to 850° C. for 60 minutes to sinter the same. According to this procedure, opposed two electrodes were formed.

Figure 3:
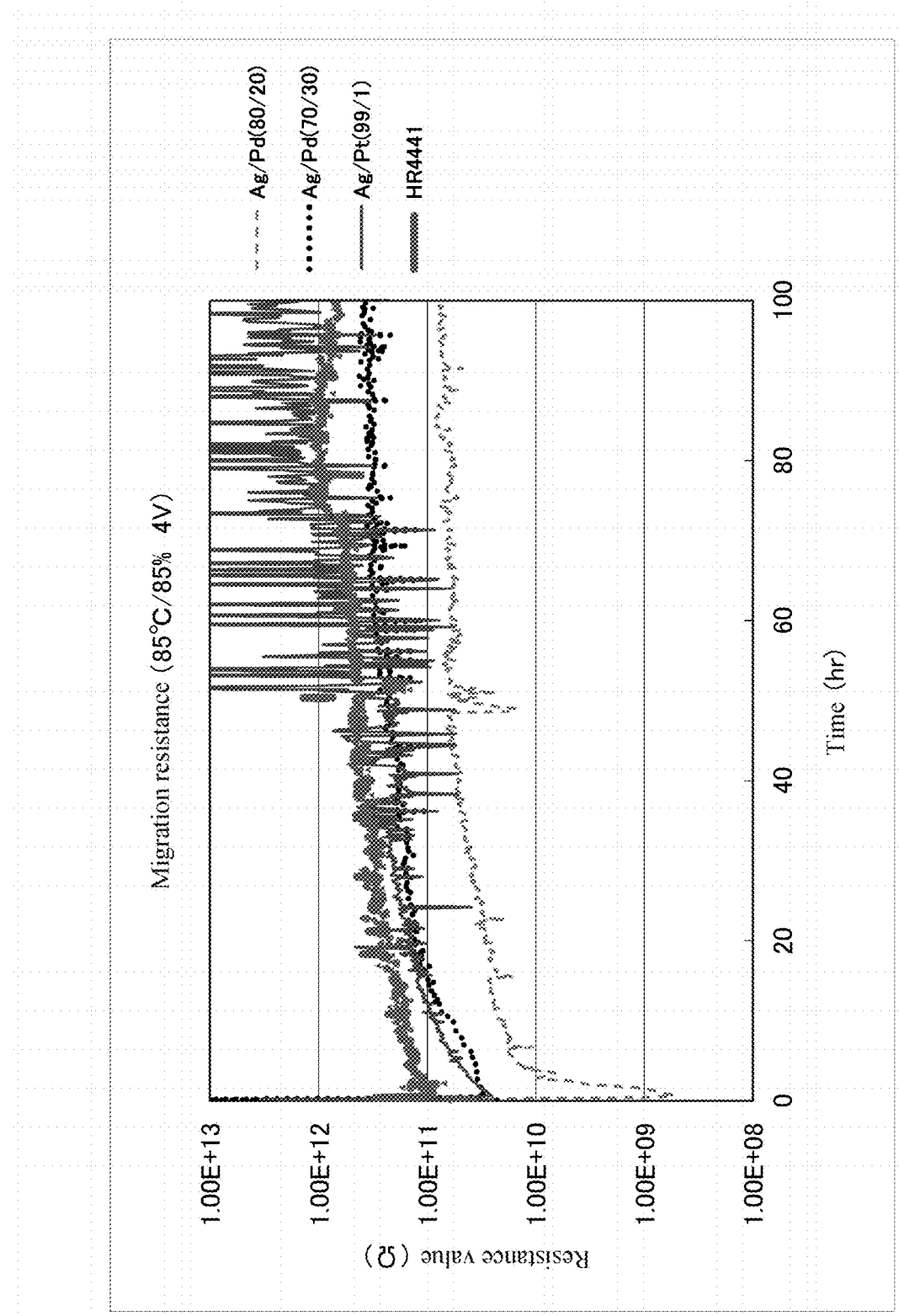
FIG. 3 is a graph showing the result of the electromigration resistance test.

Next, while applying a voltage between two electrodes, an alumina substrate onto which the two electrodes had been formed was allowed to stand under high temperature and high humidity, and the resistance value (Ω) between the two electrodes was continuously measured. The degree of the voltage to be applied to the two electrodes was set to 4V. A temperature of the circumstance into which the alumina substrate had been allowed to stand was set to 85° C. A relative humidity of the circumstance into which the alumina substrate had been allowed to stand was set to 85%. The results of the electromigration resistance test are shown in FIG. 3. In FIG. 3, HR4441 shows conductive paste (conductive paste containing CuMnSn) of Example 3.

COMPARATIVE EXAMPLES

In Comparative examples, conductive pastes were prepared in the same procedure as in the above-mentioned Examples to prepare test pieces. By using the prepared test pieces, solder wetting property test, solder heat resistance test, adhesion strength test and electromigration resistance test were carried out. Provided that in Comparative examples, the following two kinds of powders were used in place of the above-mentioned powder (D).

(Comparative Example 1) Pt Powder (Comparative Example 2) Mixed Powder Containing CuO, MoO$_3$ and SnO$_2$ The results of the solder wetting property test, solder heat resistance test and adhesion strength test in Comparative examples 1 and 2 are shown in the following Tables 4 to 6, respectively. The results of the electromigration resistance test in Comparative examples 1 and 2 are shown in FIG. 3.

TABLE 4

Solder wetting test

| Comparative example | 1 | 2 |
|---|---|---|
| Kind of powder added to conductive paste | Pt | CuO, MoO$_3$, SnO$_2$ |
| Solder wet area | 99.4% | 50.9% |

TABLE 5

Solder heat resistance test

| Comparative example | | 1 | 2 |
|---|---|---|---|
| Kind of powder added to conductive paste | | Pt | CuO, MoO$_3$, SnO$_2$ |
| Dipping conditions | 260° C., 10 s | 86.4% | 26.4% (repelling of solder) |
| | 260° C., 20 s | 75.9% | 0% (repelling of solder) |
| | 260° C., 30 s | 41.5% | 0% (repelling of solder) |
| | 260° C., 40 s | 41.3% | 0% (repelling of solder) |
| | 270° C., 10 s | 83.3% | 0% (repelling of solder) |
| | 270° C., 20 s | 61.0% | 0% (repelling of solder) |
| | 270° C., 30 s | 22.4% | 0% (repelling of solder) |
| | 280° C., 10 s | 77.6% | 0% (repelling of solder) |
| | 280° C., 20 s | 41.8% | 0% (repelling of solder) |

TABLE 6

Adhesion strength test

| Comparative example | 1 | 2 |
|---|---|---|
| Kind of powder added to conductive paste | Pt | CuO, MoO$_3$, SnO$_2$ |
| Initial [N] | 29.2 | 11.1 |
| 100 hrs after heat cycle [N] | 15.7 | 9.3 |
| 100 hrs after allowing to stand at high temperature [N] | 21.8 | 8.2 |

[Consideration]

As can be seen from the results shown in Table 1, 2 and 3 and FIG. 3, the conductor patterns obtained by sintering the conductive pastes of Examples 1 to 10 were excellent in solder wetting property, solder heat resistance, adhesion strength to the substrate and electromigration resistance.

To the contrary, as can be seen from the results shown in Tables 4, 5 and 6 and FIG. 3, the conductor pattern obtained by sintering the conductive paste of Comparative example 2 was inferior in solder wetting property, solder heat resistance, adhesion strength to the substrate and electromigration resistance.

Also, as can be seen from the results of comparison between Examples 1 to 10 and Comparative example 1, the conductive pastes of Examples 1 to 10 were superior to the conventional conductive paste containing Pt or more, while these did not contain expensive Pt.

The invention claimed is:

1. A conductive paste which comprises the following components (A) to (D):
   (A) a silver powder;
   (B) a glass frit;
   (C) an organic binder; and
   (D) an alloy powder containing Cu and Mn,
   wherein the alloy powder (D) is contained in an amount of 0.1 to 5.0 parts by mass based on 100 parts by mass of the silver powder (A), and
   wherein a mass ratio of Mn to Cu is 0.01 to 2.5:1.

2. The conductive paste according to claim 1, wherein the alloy powder (D) further contains at least one metal element other than Cu, V, Cr, Mn, Fe and Co.

3. The conductive paste according to claim 2, wherein said at least one metal element is selected from the group consisting of Ti, Ni, Zn, In, Sn, Te, Pb, Bi, Pd, Pt and Au.

4. The conductive paste according to claim 3, wherein said at least one metal element is Sn or Bi.

5. The conductive paste according to claim 1, wherein the silver powder (A) has an average particle diameter of 0.1 to 100 μm.

6. The conductive paste according to claim 1, wherein the conductive paste has a viscosity of 50 to 700 Pa·s.

7. The conductive paste according to claim 4, wherein said at least one metal element is Bi.

8. The conductive paste according to claim 4, wherein said at least one metal element is Sn.

9. The conductive paste according to claim 1, wherein the glass frit (B) is a bismuth borosilicate-based glass frit.

10. The conductive paste according to claim 2, wherein the glass frit (B) is a bismuth borosilicate-based glass frit.

11. The conductive paste according to claim 3, wherein the glass frit (B) is a bismuth borosilicate-based glass frit.

12. The conductive paste according to claim 4, wherein the glass frit (B) is a bismuth borosilicate-based glass frit.

13. The conductive paste according to claim 5, wherein the glass frit (B) is a bismuth borosilicate-based glass frit.

14. The conductive paste according to claim 6, wherein the glass frit (B) is a bismuth borosilicate-based glass frit.

15. The conductive paste according to claim 7, wherein the glass frit (B) is a bismuth borosilicate-based glass frit.

16. The conductive paste according to claim 8, wherein the glass frit (B) is a bismuth borosilicate-based glass frit.

17. The conductive paste according to claim 1, wherein the element Cu is contained in an amount of 0.005 to 2.85 parts by mass based on 100 parts by mass of the silver powder (A), and
   wherein the element Mn is contained in an amount of 0.0001 to 0.9 part by mass based on 100 parts by mass of the silver powder (A).

18. The conductive paste according to claim 17, wherein the element Cu is contained in an amount of 0.015 to 2 parts by mass based on 100 parts by mass of the silver powder (A), and
   wherein the element Mn is contained in an amount of 0.0003 to 0.7 part by mass based on 100 parts by mass of the silver powder (A).

19. The conductive paste according to claim 1, wherein the alloy powder (D) is contained in an amount of 0.2 to 3.0 parts by mass based on 100 parts by mass of the silver powder (A).

20. The conductive paste according to claim 1, wherein the alloy powder (D) is contained in an amount of 0.3 to 1.0 parts by mass based on 100 parts by mass of the silver powder (A).

* * * * *